US012646926B2

(12) United States Patent
Salehi-Moghadam et al.

(10) Patent No.: US 12,646,926 B2
(45) Date of Patent: Jun. 2, 2026

(54) ELECTRICAL POWER TRANSMISSION

(71) Applicant: Enertechnos Limited, Surrey (GB)

(72) Inventors: Mansour Salehi-Moghadam, Surrey (GB); Ashkan Daria Hajiloo, Surrey (GB)

(73) Assignee: Enertechnos Limited, Surrey (GB)

( * ) Notice: Subject to any disclaimer, the term of this patent is extended or adjusted under 35 U.S.C. 154(b) by 479 days.

(21) Appl. No.: 18/031,035

(22) PCT Filed: Oct. 11, 2021

(86) PCT No.: PCT/EP2021/078073
§ 371 (c)(1),
(2) Date: Apr. 10, 2023

(87) PCT Pub. No.: WO2022/074260
PCT Pub. Date: Apr. 14, 2022

(65) Prior Publication Data
US 2023/0378746 A1 Nov. 23, 2023

(30) Foreign Application Priority Data

Oct. 9, 2020 (GB) ...................................... 2016055
Mar. 25, 2021 (EP) ..................................... 21164988

(51) Int. Cl.
*H02H 7/22* (2006.01)
*G01R 19/165* (2006.01)
(52) U.S. Cl.
CPC ....... *H02H 7/226* (2013.01); *G01R 19/16571* (2013.01)
(58) Field of Classification Search
CPC .......... H02H 7/226; H02H 9/04; H02H 9/041; H01P 3/06; G01R 19/16571
See application file for complete search history.

(56) References Cited

U.S. PATENT DOCUMENTS 4,028,592 A 6/1977 Fahlen et al.
4,204,129 A * 5/1980 Hutchins, Jr. ............ H01B 7/30
307/146

(Continued)

FOREIGN PATENT DOCUMENTS

CN 210669491 U 6/2020
DE 102008041099 A1 * 2/2010 ............. H02H 9/041

(Continued)

OTHER PUBLICATIONS

Translation of DE 10 2008 041 099 A1. Feb. 11, 2010. (Year: 2010).*

(Continued)

*Primary Examiner* — Thienvu V Tran
*Assistant Examiner* — Christopher J Clark
(74) *Attorney, Agent, or Firm* — Bay State IP, LLC

(57) ABSTRACT

A connection-and-protection device having two capacitively connected conductors respectively connected in use to a supply cable at one end and a load cable at the other end is provided, the connection and protection device including a connection terminal for connection to either of the supply or load cables, a pair of cable terminals for the respective capacitively connected conductors, a direct connection within the device between the connection terminal and one of the pair of cable terminals, the other of the pair cable terminals not normally being connected to the connection terminal and means for connecting the other of the pair of cable terminals to the connection terminal to protect the capacitive connection of the two conductors, if the voltage between the pair of cable terminals exceeds a threshold and event detection means comprising means for detection the voltage between the pair of cable terminals exceeding a threshold.

17 Claims, 4 Drawing Sheets

(56)                    References Cited

U.S. PATENT DOCUMENTS

| 4,546,210 | A | * | 10/1985 | Akiba | .................... | H01B 7/303 |
| | | | | | | 174/DIG. 26 |
| 2011/0162872 | A1 | | 7/2011 | Mantock | | |
| 2014/0197695 | A1 | | 7/2014 | Waffenschmidt | | |
| 2015/0041172 | A1 | | 2/2015 | Gareis | | |
| 2024/0154287 | A1 | * | 5/2024 | Findeklee | .............. | G01R 33/36 |

FOREIGN PATENT DOCUMENTS

| JP | H11 275872 | A | 10/1999 |
| KR | 2012 0105163 | A | 9/2012 |
| KR | 20130009969 | A | 1/2013 |
| KR | 20190090549 | A | 8/2019 |
| WO | 2018/145128 | A1 | 8/2018 |
| WO | 2020/120932 | A1 | 6/2020 |

OTHER PUBLICATIONS

Examination Report No. 1 for Standard Patent Application, IP Australia, Aug. 29, 2024.
International Search Report, European Patent Office, Apr. 21, 2022.
Written Opinion ISA, European Patent Office, Apr. 21, 2022.
Fei Lu et al: "A Review on the Recent Development of Capacitive Wireless Power Transfer Technology", Energies, vol. 10, No. 11, Nov. 1, 2017, pp. 1-30.
Zou Lixiang Jackie et al: "A Contactless Single-Wire CPT (Capacitive Power Transfer) Power Supply for Driving a Variable Message Sign", 2018 IEEE PELS Workshop on Emerging Technologies: Wireless Power Transfer (WOW), IEEE, Jun. 3, 2018, pp. 1-5.

* cited by examiner

ELECTRICAL POWER TRANSMISSION

CROSS REFERENCE TO RELATED APPLICATION

This application is for entry into the U.S. National Phase from which priority is claimed under all applicable sections of Title 35 of the United States Code including, but not limited to, Sections 120, 363, and 365(c) to International Application No. PCT/EP2021/078073 filed on Oct. 11, 2021, and which in turn claims priority under 35 USC 119 to Great Britain Patent Application No. 2016055.2 filed on Oct. 9, 2020 and European Patent Application No. 21164988.4 on Mar. 25, 2021.

FIELD OF THE INVENTION

The present invention relates to electrical power transmission.

BACKGROUND OF THE INVENTION

Fuses and electromagnetic devices are known for protection of circuits from excess voltage and current. These are provided for most commercially used voltages and currents, be they low voltage as in handheld devices fuses, mains as in domestic appliances with circuit breakers or medium and high voltage networks with distribution circuit breakers.

Protection devices are also known for specific elements in certain circuits. For instance, the abstract of JP H11 275872 is as follows:

"PROBLEM TO BE SOLVED: To protect a capacitor from an overvoltage without increasing the energy processed by means of nonlinear resistance elements and the overcurrent duty of a power converter, when such an accident as the interline short circuit or arm short circuit occurs. SOLUTION: In a power conversion circuit having series capacitors 31-33 connected between the AC terminal of a power converter and an AC power source 2, nonlinear resistance elements 41-43, switching means (51-53) which short-circuits capacitor terminals to each other, and voltage detecting means (61-63) which detect the voltages across the capacitor terminals are connected between the capacitor terminals, and a control means 200 which turns on a short-circuiting switch about one cycle after the point of time the voltage detecting means detect an overvoltage is provided. For an interline short-circuiting current which continues over one or more cycles, the short-circuiting current is by-passed to short-circuiting switches, and for one-cycle arm short circuit, the igniting pulse of the power converter is stopped before the short-circuiting switches are turned on, and the capacitors 31-33 suppress the short-circuiting current."

Capacitive cables, as in WO 2019/234449, benefit from protection equipment in the same way as conventional distribution network cables not only for protection of equipment to which they are connected but also for their own protection. They benefit from additional protection as now explained. They comprise two capacitive plates separated by dielectric material. This is the case whether they comprise physical plates in strip form as in WO 2010/026380 or compound plates made up of a plurality of wires in juxtaposition and connected to represent plates as in WO 2019/234449. Not only can they transmit over-voltages from one end to the other and so require for conventional protection equipment to avoid application of such over-voltages, but also they are susceptible to damage to their dielectric material if excess voltages are applied across it. This excess is exhibited as too high a voltage across the conductors comprising their plates. Such voltage is readily monitored by extending the supply voltage conductor for measurement of the voltage between it and the load voltage conductor. Prima facie, where this monitored voltage exceeds a threshold, the cable can be disconnected by such equipment to protect it from the monitored voltage exceeding a dielectric damaging threshold. Disconnection can be effected by protection equipment rated for the distribution voltage. Not only does this solution add to the cost of installing a capacitive cable, it also counteracts the economic benefits of the capacitive cable and is liable to lead to undesirable disconnections. Further, it may react too slowly to protect a capacitive cable's dielectric material.

BRIEF SUMMARY OF THE INVENTION

The object of the invention is to provide improved protection equipment for a capacitive cable allowing the cable to continue to provide connection whilst protected.

According to one aspect of the invention there is provided a power-transmission cable protection-and-control arrangement for a capacitive power-transmission cable, the arrangement comprising:

at a one end termination of the cable
  a load or supply terminal for a load or supply cable,
  a pair of cable terminals for a pair of conductors of the capacitive power-transmission cable, the conductors being connected directly or via extension conductors to the terminals in use,
  one of the pair of cable terminals being connected by a rail or busbar to the load or supply terminal,
  an electromagnetic or electronic switch between the rail or busbar and the other of the pair of cable terminals and
at the one end or at another end termination of the cable:
  means for measuring the differential voltage between the pair of cable terminals, i.e. between the capacitive cable conductors in use, and
  means for controlling the switch to close in the event that the differential voltage exceeds a threshold below dielectric breakdown of the capacitive cable.
Preferably in one alternative:
  the switch controlling means is adapted to control the switch in a second or third event or separate switch controlling means is provided therefor,
  the second event is that the current in the busbar or rail is below a certain threshold and
  the third event is that the current in the busbar or rail is above a certain threshold.
In another alternative:
  a second switch controlling means is adapted to control a second switch between the rail or busbar and the other of the pair of cable terminals in a second or third,
  the second event is that the current in the busbar or rail is below a certain threshold and
  the third event is that the current in the busbar or rail is above a certain threshold.
In a further arrangement, a capacitor is provided providing or augmenting the capacitance between the conductors of the capacitive cable.

In preferred alternatives, the arrangement is as a connection-and-protection device housed in an earthed or earthable conductive casing or cabinet, with the terminals insulated to a transmission voltage and the switch being rated for the differential breakdown voltage.

Again, preferably the measuring and controlling means are housed with the terminals and the switch in casing or cabinet.

The protection-and-control device can be provided in combination with a second such device for an opposite end of the capacitive cable, the devices being adapted for wireless, wired or optic-fibre communication.

Normally the device will include autonomous devices between the between the rail or busbar and the other of the pair of cable terminals adapted to conduct and lower the differential voltage faster than the switch can close, preferably at least one of a metal oxide varistor to act as a surge arrester, a spark gap and a thyristor. More preferably, the device comprises all of a metal oxide varistor to act as a surge arrester and a thyristor.

Again normally both an electromagnetic switch and an electronic switch are provided, the electronic switch being adapted to be closed faster than the electromagnetic switch.

Preferably:

the connection means is both rated for not more than 20%, and preferably not more than 15%, of a voltage to be transmitted by the capacitive cable and adapted to be operated by lower voltage control, event detection means comprising means for detection the voltage between the pair of cables exceeding a threshold of more than 20% and preferably more than 15% of the voltage to be transmitted voltage and the device comprises a low voltage power supply in or to the casing or cabinet and a low voltage controller in the housing for causing the connection means to effect the said connection in the event of detection of the said voltage exceeding the threshold.

We note that the casing or cabinet may be in or near a sub-station having an isolated DC power supply.

The connection-and-control device can be in combination externally of the device with one or more capacitor(s) connected between the pair of cable terminals.

Normally the cable will comprise a pair of conductors in capacitive relationship along their length.

In another aspect of the invention, the connection-and-protection device is provided in combination with a power-transmission cable having two capacitively connected conductors respectively connected in use to a supply cable at one end and a load cable at the other end.

In such combination, the cable can comprise a pair of conventional elevated voltage power transmission cables, capacitively connected at either or both ends by one or more conventional capacitor, either housed as a circuit element of the connection-and-protection device or separately housed. Alternatively, the cable can comprise a pair of conductors in capacitive relationship along their length and an additional capacitor is included as a circuit element in the device.

In accordance with a third aspect of the invention, a connection-and-protection device for a power-transmission cable has two capacitively connected conductors respectively connected in use to a supply cable at one end and a load cable at the other end, the connection-and-protection device comprising:

an earthable conductive housing;

three connection terminals, each being rated to provide for termination at elevated voltage insulation from the housing and an internal connection point within the housing:

one of the connection terminals being for insulated termination and internal connection of either of the supply or load cables, the others of cable terminals being ones of a pair for insulated termination and internal connection of the respective capacitively connected conductors, or interconnecting pieces of cable from the terminals to the respective conductors, a direct connection within the housing between the one of the connection terminals and one of the pair of cable terminals, the other of the pair of cable terminals not normally being connected to the connection terminal and means in the housing for connecting the other of the pair of cable terminals to the connection terminal to protect the capacitive connection of the two conductors, in the event that the voltage between the pair of cable terminals exceeds a threshold.

Preferably there is included event detection means comprising means for detection the voltage between the pair of cables exceeding a threshold.

In a fourth aspect of the invention, there is provided a connection-and-protection device in combination with a power-transmission cable having two capacitively connected conductors respectively connected in use to a supply cable at one end and a load cable at the other end, the connection-and-protection device comprising:

an earthable conductive housing;

three connection terminals, each being rated to provide for termination at elevated voltage insulation from the housing and an internal connection point within the housing:

one of the connection terminals being for insulated termination and internal connection of either of the supply or load cables, the others of cable terminals being ones of a pair for insulated termination and internal connection of the respective capacitively connected conductors, or interconnecting pieces of cable from the terminals to the respective conductors, a direct connection within the housing between the one of the connection terminal and one of the pair of cable terminals, the other of the pair of cable terminals not normally being connected to the connection terminal and means in the housing for connecting the other of the pair of cable terminals to the connection terminal to protect the capacitive connection of the two conductors, in the event that the voltage between the pair of cable terminals exceeds a threshold:

the connection means being rated for not more than 20% of the elevated voltage and the connection means being adapted to be operated by low voltage control, event detection means comprising means for detection the voltage between the pair of cables exceeding a threshold of more than 20% of the elevated voltage a low voltage power supply in the housing and a low voltage controller in the housing for causing the connection means to effect the said connection in the event of detection of the said voltage exceeding the threshold.

An aspect of the invention relates to a power network that is switched between capacitive and convention (galvanic) modes of operating for supplying electrical power. The choice between modes can relate to load on the network, or load on a region of the network—as a network as a whole suitably comprises individual sections and each section can be operating conventionally or capacitively. The choice may be made in order to avoid damage to network equipment e.g. damage to cables or cable components.

The choice between modes may be made manually with change of mode being implemented by manual operation of a switch. The choice may be made by automated equipment e.g. monitoring load or criticality of a network-relevant factor. A network control system can also include both, i.e. a manually operated switch and also control equipment that operates the switch in accordance with pre-determined triggers.

In a fifth aspect of the invention, there is thus provided a power supply network, comprising
   a power source, connected to
   a first node, connected by two or more conductors separated by a dielectric to
   a second node, and
   a control system
   wherein the two or more conductors are capable of transmitting power between the first and second nodes in a first mode being via a galvanic connection or in a second mode as a capacitive cable, and
   wherein the control system is capable of switching the two or more conductors between the first and second modes.
   A power supply network may more specifically comprise
   (i) a power source, connected to
   (ii) a first node, connected by two or more cables, optionally separated by a dielectric, to
   (iii) a second node, and
   (iv) a control system
   wherein the two or more cables are capable of transmitting power between the first and second nodes in a first mode being via a galvanic connection or in a second mode as a capacitive cable, and
   wherein the control system is capable of switching the two or more cables between the first and second modes.

Reference to a capacitive cable is as elsewhere herein and hence includes reference in embodiments to a capacitive cable that comprises two constitutive conductors or cables in a capacitive arrangement. Two conventional cables connected at their ends by capacitors may also function as a capacitively conducting cable, though a capacitive cables comprising two or inner cables separated by dielectric is preferred.

Switching between the two or more conductors can as mentioned be carried out manually by an operator.

A dielectric protection device that is capable of switching between the two or more conductors in response to a trigger event is suitably included. A signal from this device can then initiate switching between modes. An example trigger event comprises excessive voltage between the respective conductors when operating as a capacitive conductor. A further example of a trigger event is a safety warning that operation mode of the conductors in the current mode is inappropriate. The trigger event may comprise reduction in load indicating galvanic connection is the preferred mode compared with capacitive mode.

An external monitor system may be provided to assess at what point the trigger threshold is reached. The threshold may be set so as to avoid damage to dielectric in the capacitive cable. Another appropriate threshold is when power transmission at lower load is more efficiently transmitted conventionally. A further threshold may be when inclement weather conditions indicate a switch between modes is indicated. Switching can thus occur as a result of low wind.

The monitor system suitably comprises artificial intelligence to make a decision with respect to operation mode at a network level or at network sub-section level.

In embodiments of the invention, the two or more conductors comprise a first conductor and a second conductor, wherein
   in the first mode the first end of the first conductor is connected to the first node and the second end of the first conductor is connected to the second node and/or the first end of the second conductor is connected to the first node and the second end of the second conductor is connected to the second node, and
   in the second mode the first conductor is connected at a first end to the first node but not connected at its second end to the second node, and the second conductor is not connected at a first end to the first node but is connected at its second end to the second node.

The control system preferably comprises control circuitry at both the first and second nodes, whereby switching between the first and second modes comprises operating relays at both nodes at the same time.

It should be noted that the invention is applicable to power transmission cables over a range of transmission voltages and is concerned with the voltage between two capacitively connected conductors in the power transmission cable. This voltage is lower than the voltages being transmitted. Such transmitted voltages are referred to below as "elevated voltages", be they those otherwise referred to as low, medium or high or (by various terms) even higher voltages. In short the distinction is drawn between "elevated voltage" and "lower" voltage. Insofar as the elevated voltage is the voltage at which the device overall is rated for connection to a power transmission network, the term "rated voltage" used as appropriate in place of transmission and elevated voltage.

The capacitively connected conductors connected to the supply and/or the load by the connection-and-protection device can alternatively be either
   a pair of cables in capacitive relationship along their length as described in our WO 2019/234449 or
   they can be a pair of conventional power transmission cables, capacitively connected at either or both ends, and optionally intermediately by one or more conventional capacitor.
   Such capacitor can either be housed as a circuit element of the connection-and-protection device or separately housed. In the first alternative, the threshold voltage is set to protect the dielectric between the cables in capacitive relationship; in the latter alternative, the threshold voltage is set to protect the dielectric between the plates of the capacitor, wherever housed. In both alternatives, the two capacitively connected cables are conveniently describe as the "capacitive cable". It should be noted that there is another case, in which the invention is applicable and the description "capacitive cable" is appropriate.

This is where the pair of cables are in capacitive relationship along their length, but the length is short and the capacitance between them is conveniently augmented by an additional capacitor included as a circuit element in the connection-and-protection device or indeed outside it.

The connection-and-protection device can be connected at either the load or the supply end of the capacitive cable. Normally one is connected at both ends of a long cable run. At the respective ends, the supply/load connection terminal is connected via the one of the pair of terminals to the conductor of the capacitive cable which is not connected to the supply, or load, cable at the other end. The supply cable at one end is connected capacitively, by the conductors of the capacitive cable and/or the separate capacitor, to the load cable at the other end.

Where the connection-and-protection devices are provided at both ends of a long run of capacitive cable, they will normally be adapted for communication between them, whereby they can be operated together.

In normal use, the connection-and-protection device merely provides straight through connection from the supply, or load, to the respective conductor of the capacitive cable.

Normally the connection-and-protection device will include two rails/bus bars. One will, having the supply/load connection terminal at one end and the one of the pair of cable terminals at the other end, comprise the direct connection in the device. The other rail/bus bar is isolated at one end and the other of the pair of cable terminals is connected at the other end. The said connection means is arranged between the rails. It is envisaged that whilst this rail/bus bar arrangement is convenient, other configurations are convenient.

In general terms, events causing voltage or current thresholds to be exceeded are transient events such as lightning or longer duration such as cable damage related, possibly by trees falling on a line elsewhere in the network. Lightning can cause impulses liable to damage dielectric by excess voltage across it.

Cable damage can cause current surges, ohmically heating the cables' conductors and damaging dielectric in this way. Other unusual events or usual events, such as switching, causing voltage or current thresholds to be exceeded are possible.

In the event of a voltage surge, as from lightning, on either of the load or supply cables, or conceivably one of capacitive cables, the voltage between the pair of terminals and therefore across the plates of the capacitive cable will rise. If this is detected by the connection means to exceed the threshold, the three terminals are directly connected together by the connection means, by connection of the rails/bus bars together, where these are provided.

An impulse such as lightning being a very steep fronted event in terms of voltage rise, the connection means conveniently includes a spark gap component between the pair of terminals conveniently via the rails. This component conducts as soon as the voltage across its gap exceeds its threshold, limiting the voltage between the conductors.

To accommodate high energy impulses which might cause the capability of the spark gap component to be exceeded, a surge arrestor component can be connected in parallel with the spark gap. Surge arresters allow more current to flow by temporary conduction of their semiconductor material, whilst maintaining a voltage across them below the dielectric damaging level.

In addition to the spark gap and surge arrester, the device can comprise as another passive component, i.e. one not operated by a controller, a metal oxide varistor between the pair of terminals conveniently via the rails.

Again an impulse can continue for so long as and at such current that the voltage across them can be too high. To accommodate this terminal connection means can include an active component such as one or more switches between the pair of terminals conveniently via the rails. The switch can be physical such as a relay or electronic, such as a thyristor.

The result is that the conductors of the capacitive cable are short circuited together, directly connecting the supply cable to the load cable, with no voltage between the conductors and no voltage across dielectric material between the plates of their capacitors. This protects the dielectric material from a potentially damaging voltage across it.

In the event of a current surge in either of the load or supply cables, or conceivably one of capacitive cables, the current in the direct connection within the device between the connection terminal and one of the pair of cable terminals will rise. If this is detected by the connection means to exceed the threshold, the three terminals are directly connected together by the connection means, conveniently by the switch. Again. the result is that the conductors of the capacitive cable are short circuited together, directly connecting the supply cable to the load cable, with the current shared between the two capacitively connected conductors.

Insofar as the other-cable-terminal to connection-terminal connection means will normally comprise a switch and switches are normally rated for voltage between their contacts prior to closure, the connection means can be rated for the rated voltage of the network into which the connection-and-protection device is connected. However we have been surprised to realise that the actual voltage between the terminals to be switched together is normally an order of magnitude lower than the rated voltage. This is because the voltage between the rails is dependent on the cable current acting on the capacitance between the plate elements of the capacitor. Thus, the voltages in question, being only proportional to the capacitance and the current and not the rated voltage, are lower than the rated voltage.

In practice this can enable the components of the connection means including the switch, to be rated for operation at lower voltage than the rated voltage of the device per se as long as the applicable safety standards are maintained.

Accordingly, bearing in mind that the rated voltage is in practice an insulation to ground rating, preferably, the voltage threshold at which connection is made is less than 20% of the insulation to ground rating voltage of the connection-and-protection device and the connection means is comprised of components rated for lower voltage of less than 20% of the insulation to ground rating. Typically the 20% figure can be 15% in both instances.

The operational current rating is (due to loss minimisation, lower skin/proximity effect) equal to or slightly higher, 5% to 10%, than that of a conventional cable of equivalently sized cross-sectional area of copper or aluminium conductor. Thus, the current threshold at which connection is made is 20% higher than the current rating of a conventional cable of equivalently sized cross-sectional area of copper conductor.

Normally, in the case of the capacitive cable being as described in WO 2019/234449, it will comprise several layers of conductive load and supply strands, in capacitive relationship by alternation within layers or between layers. It is the dielectric between the load and supply strands and/or their layers which is protected by embodiments of the invention. Choice of dielectric is not part of the fundamental invention. Typically the dielectric is lacquer as the lacquer of so-called magnet wire or a non-conductive polymeric material between layers of non-enameled wire. At the ends of the cable, the strands of the respective conductors can be bundled and led to the protection device. However, it is preferred to bundle them and connect them to the above-mentioned pieces of conventional cable led to the protection device. The supply and load cable are likely to be of the same type of conventional cable. Preferably these cables, or pieces thereof, have grounded sheaches in their extent from the protection device.

For installations where the connection-and-protection device is to be used with short lengths of capacitive cable or two cables with negligible capacitance between them, the device can have housed within it capacitance to provide the capacitive cable or the two cables with the advantages of capacitive cable. Alternatively, the connection-and-protection device can be installed with external capacitance to provide these advantages.

Preferably, the protection equipment has a conductive case in which the connection means and joints of the three conductors to the connection means are surrounded. Preferably, the connection means and the three conductors will all be electrically isolated with respect to the conductive case, with the latter having provision for its grounding in use which can be by the grounded cable-sheaves or by a separate earth connection.

In use, the voltage on the supply conductor induces a voltage on the load conductor of the capacitive cable. Under some network conditions, such as low load, the capacitive nature of the cable provides little advantage and the switch can be closed to connect all of the device's terminals together. For this the device is conveniently provided with a wired or wireless interface for remotely controlling the switch to close. Such interface can be the same as for communication with another such device at the other end of a long cable run.

As the load and thus current increases, the voltage differential between the load conductor and supply conductor will increase. Whilst the conductors all carry the rated voltage of their cables with respect to earth, the relative voltage between the conductors of the capacitive cable tends to be at least an order of magnitude less than the rated voltage. For this reason, the dielectric material between the conductors of the capacitive cable can be rated to the relative voltage at full load.

For analogous reasons the connection means of the protection equipment is rated to react and make contact at the order of magnitude lower voltage, not the rated voltage. Indeed, if it were rated to react at the rated voltage, the dielectric would have been destroyed before the connection means reacted. In other words, the threshold is preferably set at substantially an order of magnitude less than the rated voltage or indeed less still.

The connection means preferably comprises as circuit elements a separate voltage detection means, as in a voltage measuring circuit, and an element, such as a switch, closed on the voltage threshold being detected.

The voltage between the conductors of the capacitive cable, can be disturbed by a variety of factors and the connection means can include a corresponding variety of devices.

The connection means can comprise its own detection of whether the voltage threshold has been exceeded, as in a circuit element such as a spark gap device, which conducts on voltage exceeding that at which the gap is jumped. Alternatively, there can be provided separate voltage detection means, as in a voltage measuring circuit, with the connection means comprising a circuit element, such as a switch, closed on the voltage threshold being reached.

Whilst the above description envisages connection of the two capacitively connected cables in the event of the voltage between them exceeding a threshold, there is another scenario in which it may be desirable to make the connection, namely in event of the current demand on the cable being low. In such case, the advantage of the cable being a capacitive cable is liable to be negligible or even disadvantageous. Accordingly, the device can contain means for connection of the two conductors in the event of the current being below such a threshold. Normally the connection means is the same as for the voltage between the conductors exceeding a threshold, i.e., preferably a controlled active component such as a switch. Alternatively a separate actively controlled component can be provided.

We prefer for the device to default on start-up to the cable conductors being connected together. In this case, one component is normally closed and controlled to open when the current threshold is reached and the other is controlled to close in the event of excessive voltage.

According to another aspect of the invention there is provided a connection-and-protection device in combination with a power-transmission cable having two capacitively connected conductors respectively connected in use to a supply cable at one end and a load cable at the other end, the connection-and-protection device comprising:

a supply/load connection terminal for connection to either of the supply or load cables, a pair of cable terminals for connection to the respective capacitively connected conductors, or interconnecting pieces of cable from the terminals to the respective conductors, a direct connection within the device between the supply/load connection terminal and one of the pair of cable terminals, the other of the pair of cable terminals not normally being connected to the supply/load connection terminal and means for connecting the other of pair of cable terminals to the supply/load connection terminal to protect the capacitive connection of the two conductors, in the event that the voltage between the pair of cable terminals exceeds a threshold or the current in the direct connection exceeds a threshold.

Normally the power-transmission cable having two capacitively connected conductors is in combination with two such connection-and-protection devices, one at one end and the other at the other end.

The connection-and-protection devices can incorporate capacitors for enhancing the capacitive connection of the conductors.

In embodiments of the invention two or more relays are used, which can simplify control. In these embodiments the device/system comprises a normally closed relay providing for night use, which is opened by the current rising above a threshold and a normally open relay which is closed by the differential voltage rising above a threshold.

This is optionally entirely automatic with no need for control circuitry, e.g. if the coil of the NC relay was energised by an inductive loop around the main busbar and the NO relay was energised by an ohmic line between the busbars.

BRIEF DESCRIPTION OF THE SEVERAL VIEWS OF THE DRAWINGS

To help understanding of the invention, a specific embodiment thereof will now be described by way of example and with reference to the accompanying drawings, in which.

DETAILED DESCRIPTION OF THE INVENTION

Figure 1:
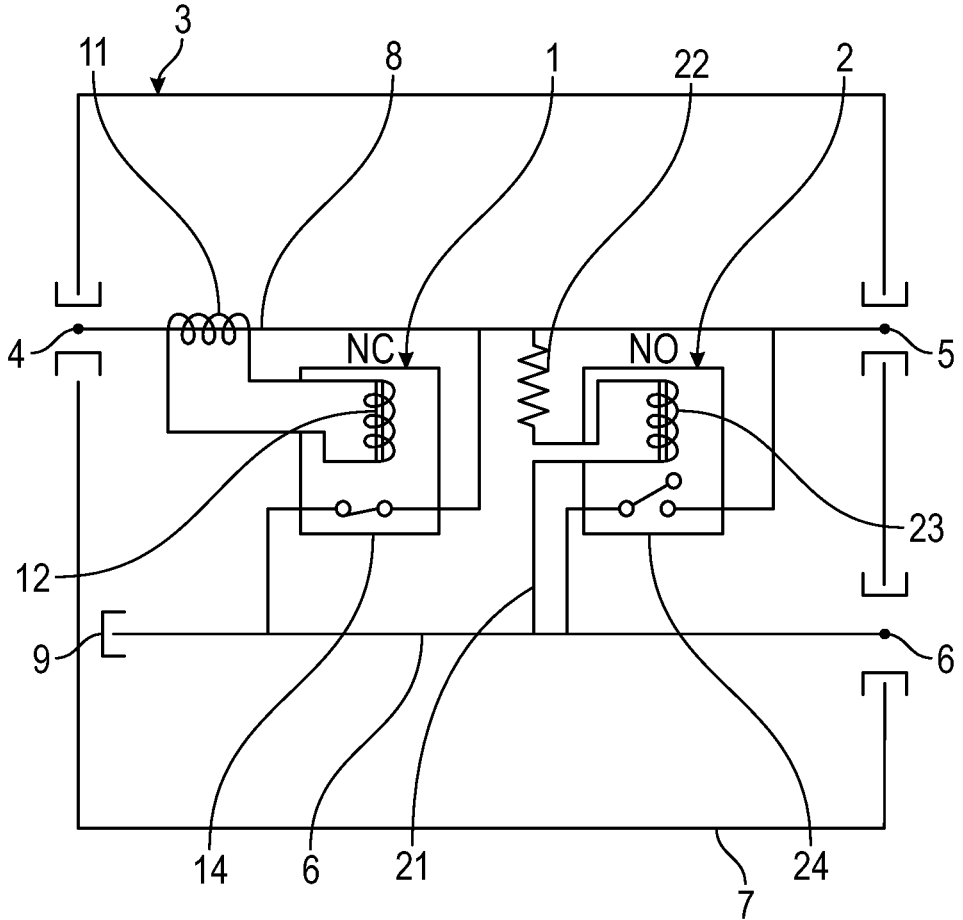
FIG. 1 is a diagram of a basic connection-and-protection device of the invention.

Referring to FIG. 1 of the drawings, a first embodiment is described in which there are two active controlled components, one component 1 is normally closed and controlled to open when a current threshold is reached and the other 2 is controlled to close in the event of excessive voltage. The device has a conductive housing 3, with three terminals 4,5,6 insulatedly provided in the wall 7 of the housing. Within the housing a busbar 8 extends between the terminals 4,5. A further busbar extends from the terminal 6 to an insulated receptacle 9 on the other side of the housing.

An inductive current sensing coil 11 is provided around the busbar 8 in series with a coil 12 of a normally closed (NC) relay 14 having contacts connected to the respective busbars. On start-up when no current is flowing through the device, via the busbar 8, the terminals 5,6 are connected together by the NC relay. When the current reaches a current threshold, sufficient current flows in the coils 11,12 to open the relay and allow capacitive operation of a capacitive cable having its conductors connected to the terminals 5,6.

A voltage sensing line 21, with a high series resistor 22 (sized to cause sufficient current to flow only for the following purpose), is connected in series with the coil 23 of a normally open (NO) relay 24. Its contacts are connected respectively to the busbars. Normally, on start-up and normal operation, the voltage between the busbars and the conductors is within the capabilities of dielectric between the conductors and the relay 24 remains open. Should the voltage between the busbars 6,8/the terminals 5,6/the cable conductors (not shown in FIG. 1) exceed a threshold at which the dielectric is in potential danger, the sufficient current flows in the line 21, resistor 22 & coil 23 for the NO relay to close, connecting the conductors together as at start-up, but by the relay 24 as opposed to the relay 14.

As described, this embodiment is expected to require special tuning of the relays for the currents in their coils to operate at the desired current and voltage thresholds. For this reason, the relays are preferably controlled by a control circuit and indeed a single relay is preferably employed as now described in a second embodiment.

It should however be noted that the simplest embodiment of the invention requires only one NO relay, or other electronic switch, arranged to close on the inter-conductor voltage exceeding the threshold.

Figure 2:
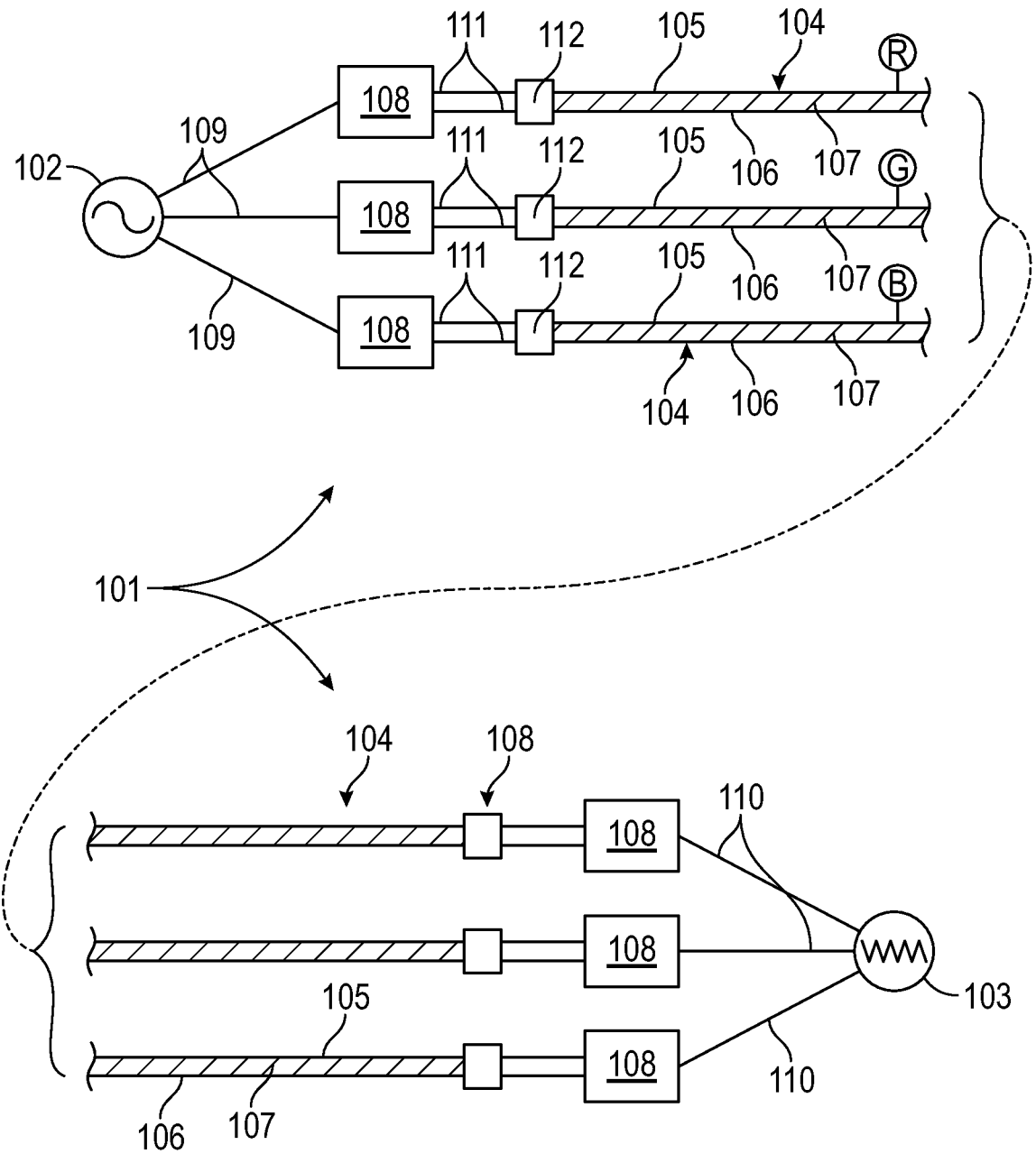
FIG. 2 is a three phase supply including connection-and-protection devices of the invention.
Figure 3:
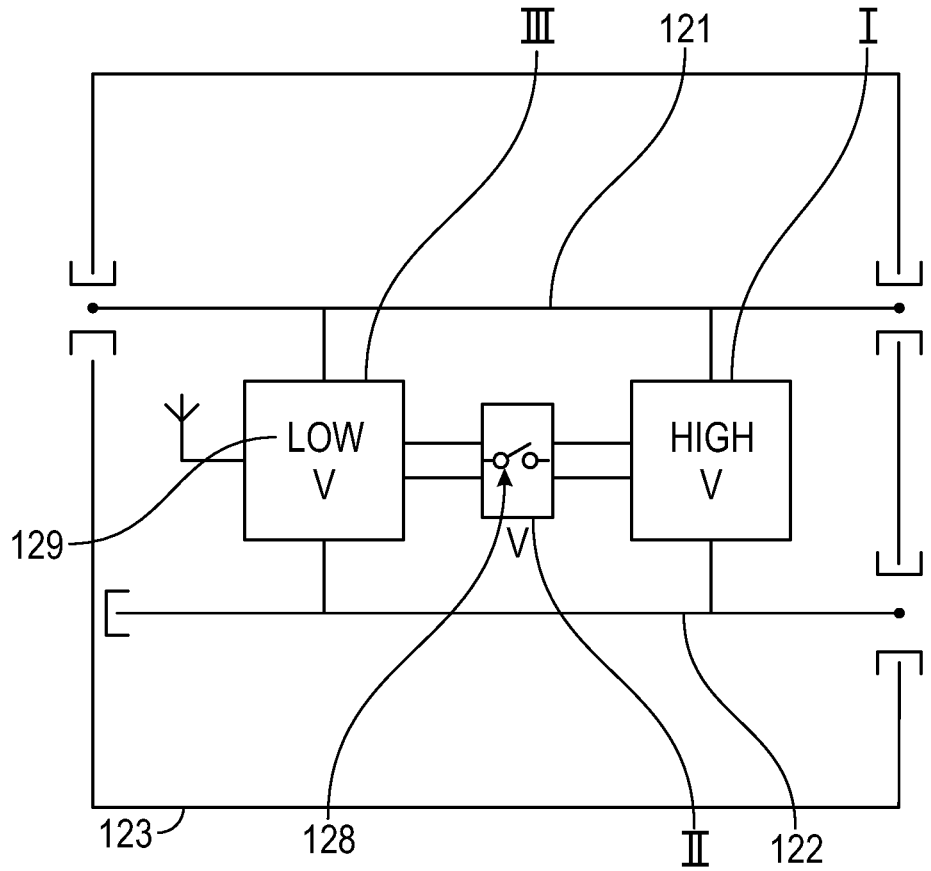
FIG. 3 is a block diagram of grouping of the components of a protection-and-control device of the invention.
Figure 4:
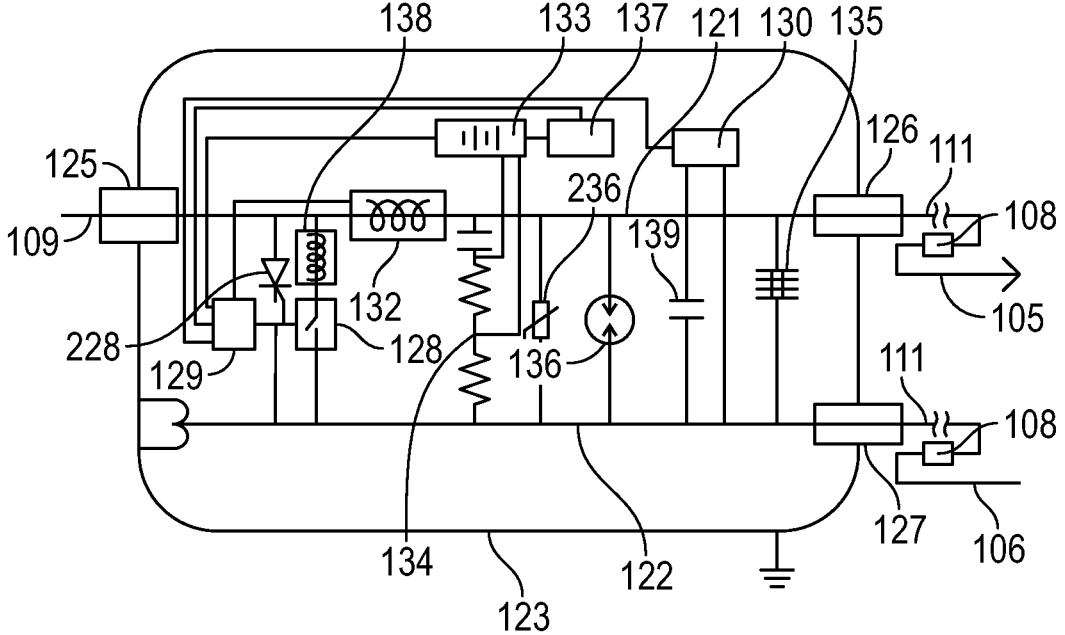
FIG. 4 is a circuit diagram of an exemplary connection-and-protection device of the invention.

Referring to FIGS. 2 to 4 of the drawings, a second embodiment is described. An elevated, transmission voltage, typically 33 kV, distribution network 101 is provided between a supply 102 and a load 103. These and other features of the network are shown diagrammatically in FIG. 1. It is a three phase network, with the phases indicated as R,G,B, as such some of the features are triplicated. However, insofar as the features of this invention are provided in each phase, i.e. the three of them as respective features, they have common reference numerals.

The main cables of the network are capacitive cables 104, each having a supply-connected plate 105 and a load-connected plate 106 with dielectric 107 between them. The plates and dielectric are shown diagrammatically. One of the plates is connected at one end and the other at the other end. The non-connected ends are normally simply disconnected.

Connection-and-protection devices 108 are provided in each phase between supplies cable 109 and load cables 110, with the inter-position of short lengths 111 of conventional cable from the devices 108 and the capacitive cables 104. Connection between the cables 104 and 111 are by connectors 112, shown diagrammatically. They can be as described in our WO 2019/234449, in particular FIGS. 6 to 10 thereof.

The connection-and-protection devices 108 are all identical and a representative one only is described with reference to FIG. 4. These are elevated voltage devices utilising lower voltage components, some of which are operated by much lower, electronic voltage control circuitry. By this is intended that the devices have insulation to earth appropriate for an electricity distribution network. For example, this elevated voltage is typically 33 kV. As explained above, the instantaneous voltage between the capacitor plates is an order of magnitude lower than the elevated voltage. This has the consequence that the capacitive plates of the cables, in practice made up of multiple strands and which are the capacitive conductors, can be separated by dielectric rated much lower. In other words, the breakdown voltage of dielectric can be of the order of one third of the cable's rated voltage. In turn, the connection-and-protection devices can be rated to react to unusual voltage of 15% to 20% of the rated voltage to protect the dielectric. This is the lower voltage. The associated circuitry for operating at least some on the lower voltage components can operated at electronic circuit voltage, typically 12 volts. This relationship of voltages in shown in FIG. 3.

As shown in FIGS. 2 & 4, in broad outline the connection-and-protection devices have a straight-through connection rail 121, from a supply/load cable 109,1010 to one of the plates 105,106 of a capacitive cable for, and an isolated rail 122 for the other plate 106,105. The cables 104 being capacitive, at the supply end, the plate 105 is directly connected straight through by the rail 121 with the plate 106 connected to the isolated rail 122; whilst at the load end of the capacitive cable, the plate 106 is connected straight through to the load by the connection rail 121 whilst the plate 105 is connected to the isolated rail 122.

That said, the exemplary connection-and-protection device will now be described as a standalone device. It has a steel outer case 123, which is provided with an earth connection appropriate for its distribution cable connection. The structural arrangement of the case or cabinet is determinable by the skilled person in accordance with the electrical features now described.

The two rails 121,122 are arranged across the case 123. The straight-through/direct-connection rail 121 has two cable terminals in the form of connectors 125,126, one at either end. They can be socket parts of Pfisterer MV-Connex cable connectors, as described at https://www.pfisterer.com/fileadmin/pfisterer/downloads_en/CableSystemMV-CT-EN.pdf. The connected cables are provided with plug parts, connecting the core of the cables to the rail and the cable sheath to the outer case 121. The isolated rail is insulatingly mounted at one end and provided with a cable terminal/connector 127 at the other end. Various circuit elements are connected to the rails and between them.

As shown in FIG. 3 the circuitry now described is arranged in three groups:

High voltage components in group I which are connected directly between the busbar rails 121,122 for current flow from one to the other, in the event that the voltage between the rails exceeds the voltage threshold;

Low voltage control circuitry components in group III which are receive power from the rails, monitor the current they are carrying and their relative voltage;

A threshold voltage rated switch 128 in group II for conducting current between the rails as required under control from the group III components.

The components are all fully insulated via high voltage insulation from the conductive, earthed in use casing 123, to guard against failure of insulation from one group to the next. In other words, despite the switch 128 and the Group I components being connected by their terminals to the rails, it and they experiences only inter-rail voltage and can be rated for the inter-rail voltage. The internal insulation of the switch insulates the rail voltage from the low voltage on its control wiring, which is connected to the low voltage control circuitry.

The components can be mounted all on a single board, with the board being insulated with line voltage rated insulation from the casing. However, the Group I components can be mechanically and electrically connected between the rails. The contacts of the switch 128 can be also.

The low voltage components are mounted on a printed circuit board, fully insulated to transmission line voltage from the casing.

An element between the rails is the normally open switch 128, with a driver circuit 129 for the switch. As shown in FIG. 3, the switch is adapted to receive wireless control signals. The purpose of the switch is to short circuit the two rails together so that no potential can exist between them in the event of the inter-rail voltage exceeding a threshold. It should be particularly noted that although the cables, the connectors and the rails are rated for 33 kV, the switch operates at 4 kV. The possibility for this apparent dichotomy is that under normal operating conditions, the capacitive connection of the two plates 105,106 of the capacitive network cable 104 causes the voltage differential between the load plate and the supply plate to be dependent on the cable current acting on the capacitance between the plate elements of the capacitor. Therefore, the instantaneous voltage between the plates and the rails is smaller, in fact substantially an order of magnitude smaller, than the nominal peak voltage of 33 kV, or other voltage concerned. The dielectric in cables such as our WO 2019/234449 is rated for the instantaneous voltage between the plates. This is why circuit components in the connection-and-protection device can be rated at the lower voltage.

In another mode switch 128 is normally closed, with the above-described operation adapted mutatis mutandis. When normally closed this state allows the cable to "fail safe" to conventional mode by shorting red and green in the event of system losing external DC power to the control circuits. Thus upon instruction to enter capacitive mode the relay switch is held open electromechanically and the trigger removes the power to the relay thus allowing it to revert to the closed position.

Referring to FIG. 4, the voltage between the rails is measured by a measuring circuit 130. If the voltage exceeds a threshold, typically 4 kV, the circuit passes a signal to a driver 129 for the switch 128. The driver closes the switch and the two rails 121, 122 are connected together by the switch, removing the voltage difference between them. Because the switch is an electromagnetic relay switch, it has a takes a discernible time to close in the case of events such as lightning strike, in other words because it is too slow, a thyristor switch 228 is provided in parallel with it and operated by the same driver 129. Other even faster components are provided as described below.

Also included in the device is a current transformer 132 for detecting excess current in the rail 121 and passing a signal to the driver 129 for closure of the switch and sharing of the excess current by both capacitive conductors. The driver is also adapted to maintain the switch closed after start-up and at other times, when the current in the rail 121 is below anther, lower threshold.

In other words, the current transformer performs a further purpose in detecting when the current is below a low threshold, belong which it advantageous for the capacitive conductors to operate as a conventional conductor. The switch is arranged as a normally closed relay switch, whereby it is closed when the capacitive cable is first switched into operation—by conventional network switches not shown.

Other circuit components in the device are:

a low voltage power supply 133, including a rectifier and a battery, powering other components, including the switch driver 131, a voltage divider 134 between the rails for supplying AC at electronic circuitry voltage to the power supply, a metal oxide surge arrester 135 for limiting transitory voltage peaks between the rails, such as caused by impulses. This is via the semiconductor nature of the surge arrester allowing current to flow between the rails when the transitory voltage rises to the break down voltage of the arrester. Preferably the arrester is specified to break down at substantially half the voltage at which the switch is controlled to operate, i.e. 2 kV in this embodiment. The ensures that whilst the transitory voltage is limited by the surge arrester to 2 kV, the switch will not be operated. If the power of the transitory voltage, i.e. the power of the impulse is too high, this may not be possible, particularly if the surge arrester is burned out, a spark gap 136 for passing steep sided impulses between the rails. In the same way that the surge arrester can be expected to act faster than the switch and its driver, the spark gap is provided to conduct before a steep sided spike causes the surge arrester to start conducting. Conveniently the conduction voltage of the spark gap is the same as that of the surge arrester. A further device in parallel with the surge arrester and the spark gap is a varistor 236 to provide further assurance that the dielectric of the capacitive cable is protected before the switch, in its electromagnetic and thyristor forms, are able to react.

It should be noted that surge arrestor, spark gap, varistor and indeed the capacitor 139 below fall into group I as regards insulation in that they are fully exposed to line voltage vis-à-vis the earthed conductive casing.

The power supply and the monitoring circuitry fall in group III, operating at low voltage and only being exposed the line voltage at in a manner to protect this circuitry from experiencing the full line voltage or indeed the inter-conductor voltage, in the manner of the group I components.

The switch is referred to as being a group II component, because the voltage between its contacts to the rails and its control contacts should never exceed an order of magnitude or so below the line voltage to earth.

The switch when closed due to voltage threshold or current threshold being exceeded, remains closed until the disturbance causing the excess voltage or current has dissipated. Only when the current as measured by the current measurement device 132 falls below the high current threshold, does the switch driver open the switch again and normal operation resumes. The monitoring and switching is managed by a controller 137 driven by the power supply and passing "close" or "open" signals to the switch driver as appropriate.

Each switch operation can be expected to give rise to capacitive discharge currents in the switch. To protect this, a current damper 38 is in series with the switch 128 as part of the connection means.

Also included within the device is an optional capacitor 139. One or more of these may be mounted in the case 123 or externally. Its function is to increase the capacitance between the capacitively connected conductors, particularly when these are conventional cables capacitively connected only by such capacitors 139.

The invention is not intended to be restricted to the details of the above-described embodiments. For instance, the connection-and-distribution devices can be mounted in an earthed cabinet within a substation. In this case the outer earthed case 123 can be dispensed with. Again, where the connection-and-distribution devices are installed in such a substation cabinet, they can be powered from the substation's own power supply. The switch driver 129 can be provided with a further input from a wired or wireless input port, whereby the switch 128 can be closed as network conditions indicate to be desirable. Indeed, measurements of network current and/or inter-conductor voltage can be provided from without the earthed case &/or indeed the earther cabinet and control signal &/or power for closure of the relay can be provided into the case/cabinet for closure of the inter-conductor switch in accordance with the measurements and/or external control. This is particularly the case where measurements at one end of a capacitive cable cause closure at the one end and it is desirable to effect closure at the other end as well.

The invention claimed is:

1. A power-transmission cable protection-and-control arrangement for a capacitive power-transmission cable, the arrangement comprising:
   at a one end termination of the cable:
      a load or supply terminal for a load or supply cable,
      a pair of cable terminals for a pair of conductors of the capacitive power-transmission cable, the conductors being connected directly or via extension conductors to the terminals in use,
         one of the pair of cable terminals being connected by a rail or busbar to the load or supply terminal,
         an electromagnetic or electronic switch between the rail or busbar and the other of the pair of cable terminals, and
   at the one end or at another end termination of the cable:
      measuring means for measuring the differential voltage between the pair of cable terminals, i.e. between the capacitive cable conductors in use, and
      switch controlling means for controlling the switch to close in the event that the differential voltage exceeds a threshold below dielectric breakdown of the capacitive cable.

2. The power-transmission cable protection-and-control arrangement of claim 1, including a capacitor providing or augmenting the capacitance between the conductors of the capacitive cable.

3. The power-transmission cable protection-and-control arrangement of claim 1, arranged as a connection-and-protection device housed in an earthed or earthable conductive casing or cabinet, with the terminals insulated to a transmission voltage and the switch being rated for the differential breakdown voltage.

4. The connection-and-protection device of claim 3, wherein the measuring means and controlling means are housed with the terminals and the switch in casing or cabinet.

5. The connection-and-protection device of claim 4, in combination with a second such device for an opposite end of the capacitive cable, the devices being adapted for wireless, wired or optic-fibre communication.

6. The connection-and-protection device of claim 3, including autonomous devices between the between the rail or busbar and the other of the pair of cable terminals adapted to conduct and lower the differential voltage faster than the switch can close.

7. The connection-and-protection device of claim 3, including both an electromagnetic switch and an electronic switch, the electronic switch being adapted to be closed faster than the electromagnetic switch.

8. The connection-and-protection device of claim 3, in combination externally of the device with one or more capacitor(s) connected between the pair of cable terminals.

9. The connection-and-protection device and cable combination of claim 8, wherein the cable comprises a pair of conductors in capacitive relationship along their length.

10. The connection-and-protection device of claim 3, in combination with a power-transmission cable having two capacitively connected conductors respectively connected in use to a supply cable at one end and a load cable at the other end.

11. The connection-and-protection device and cable combination of claim 10, wherein the cable comprises a pair of conventional elevated voltage power transmission cables, capacitively connected at either or both ends by one or more conventional capacitor, either housed as a circuit element of the connection-and-protection device or separately housed.

12. The connection-and-protection device and cable combination of claim 10, wherein the cable comprises a pair of conductors in capacitive relationship along their length and an additional capacitor is included as a circuit element in the device.

13. A connection-and-protection device for a power-transmission cable having two capacitively connected conductors respectively connected in use to a supply cable at one end and a load cable at the other end, the connection-and-protection device comprising:
   an earthable conductive housing;
   three connection terminals, each being rated to provide for termination at elevated voltage insulation from the housing and an internal connection point within the housing:
      one of the connection terminals being for insulated termination and internal connection of either of the supply or load cables,
      the others of cable terminals being ones of a pair for insulated termination and internal connection of the respective capacitively connected conductors, or interconnecting pieces of cable from the terminals to the respective conductors,
   a direct connection within the housing between the one of the connection terminals and one of the pair of cable terminals, the other of the pair of cable terminals not normally being connected to the one of the connection terminals, and
   connection means in the housing for connecting the other of the pair of cable terminals to the one of the connection terminals to protect the capacitive connection of the two conductors, in the event that the voltage between the pair of cable terminals exceeds a threshold.

14. The connection-and-protection device of claim 13, including event detecting means for detection the voltage between the pair of cables exceeding a threshold.

15. A connection-and-protection device in combination with a power-transmission cable having two capacitively connected conductors respectively connected in use to a supply cable at one end and a load cable at the other end, the connection-and-protection device comprising:

an earthable conductive housing;

three connection terminals, each being rated to provide for termination at elevated voltage insulation from the housing and an internal connection point within the housing:

one of the connection terminals being for insulated termination and internal connection of either of the supply or load cables, the others of cable terminals being ones of a pair for insulated termination and internal connection of the respective capacitively connected conductors, or interconnecting pieces of cable from the terminals to the respective conductors, a direct connection within the housing between the one of the connection terminals and one of the pair of cable terminals, the other of the pair of cable terminals not normally being connected to the one of the connection terminals, and connection means in the housing for connecting the other of the pair of cable terminals to the one of the connection terminals to protect the capacitive connection of the two conductors, in the event that the voltage between the pair of cable terminals exceeds a threshold:

the connection means being rated for not more than 20% of the elevated voltage, and the connection means being adapted to be operated by low voltage control, event detection means for detecting the voltage between the pair of cables exceeding a threshold of more than 20% of the elevated voltage, a low voltage power supply in the housing, and a low voltage controller in the housing for causing the connection means to effect the said connection in the event of detection of the said voltage exceeding the threshold.

16. A power-transmission cable protection-and-control arrangement for a capacitive power-transmission cable, the arrangement comprising:

at a one end termination of the cable:

a load or supply terminal for a load or supply cable, a pair of cable terminals for a pair of conductors of the capacitive power-transmission cable, the conductors being connected directly or via extension conductors to the terminals in use, one of the pair of cable terminals being connected by a rail or busbar to the load or supply terminal, an electromagnetic or electronic switch between the rail or busbar and the other of the pair of cable terminals, and at the one end or at another end termination of the cable:

measuring means for measuring the differential voltage between the pair of cable terminals, i.e. between the capacitive cable conductors in use, and switch controlling means for controlling the switch to close in the event that the differential voltage exceeds a threshold below dielectric breakdown of the capacitive cable, wherein the switch controlling means is adapted to control the switch in a second or third event or separate switch controlling means is provided therefor, the second event is that the current in the busbar or rail is below a certain threshold and the third event is that the current in the busbar or rail is above a certain threshold.

17. The power-transmission cable protection-and-control arrangement of claim 16, arranged as a connection-and-protection device housed in an earthed or earthable conductive casing or cabinet, with the terminals insulated to a transmission voltage and the switch being rated for the differential breakdown voltage.

* * * * *